United States Patent
Fleissner

(10) Patent No.: US 10,249,845 B2
(45) Date of Patent: Apr. 2, 2019

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventor: Arne Fleissner, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/771,108

(22) PCT Filed: Oct. 11, 2016

(86) PCT No.: PCT/EP2016/074359
§ 371 (c)(1),
(2) Date: Apr. 26, 2018

(87) PCT Pub. No.: WO2017/071948
PCT Pub. Date: May 4, 2017

(65) Prior Publication Data
US 2019/0058155 A1    Feb. 21, 2019

(30) Foreign Application Priority Data
Oct. 28, 2015 (DE) .......................... 10 2015 118 417

(51) Int. Cl.
*H01L 51/00* (2006.01)
*H01L 27/32* (2006.01)
(Continued)

(52) U.S. Cl.
CPC ...... *H01L 51/5253* (2013.01); *H01L 51/5203* (2013.01); *H01L 51/56* (2013.01);
(Continued)

(58) Field of Classification Search
CPC ............. H01L 51/5253; H01L 51/5203; H01L 51/0545; H01L 51/56; H01L 21/775
(Continued)

(56) References Cited

U.S. PATENT DOCUMENTS

2006/0249762 A1   11/2006 Rieve et al.
2012/0126270 A1    5/2012 Yamazaki et al.
(Continued)

FOREIGN PATENT DOCUMENTS

DE        19719162 A1   11/1998
DE     102009024411 A1    9/2010
(Continued)

OTHER PUBLICATIONS

International Search Report based on application No. PCT/EP2016/074359 (5 pages and 2 pages of English translation) dated Jan. 18, 2017 (Reference Purpose Only).
(Continued)

*Primary Examiner* — Thinh T Nguyen
(74) *Attorney, Agent, or Firm* — Viering, Jentschura & Partner MBB

(57) ABSTRACT

An optoelectronic component, comprising an electrically conductive layer, an electrically insulating layer formed above a partial region of the electrically conductive layer, an electrically weakly conductive encapsulation layer formed outside the partial region on the electrically conductive layer and above the partial region on the electrically insulating layer, a first electrode formed above the partial region on the electrically weakly conductive encapsulation layer, an organic functional layer structure formed on the first electrode, and a second electrode formed above the partial region on the organic functional layer structure and where the second electrode is formed outside the partial region on the electrically weakly conductive encapsulation layer.

15 Claims, 4 Drawing Sheets

(51) Int. Cl.
    *H01L 51/52*     (2006.01)
    *H01L 51/56*     (2006.01)
    *H01L 51/05*     (2006.01)

(52) U.S. Cl.
    CPC ....... *H01L 27/3239* (2013.01); *H01L 51/0011* (2013.01); *H01L 51/0541* (2013.01)

(58) Field of Classification Search
    USPC ............. 257/40, 59, 72; 438/82, 99, 48, 128
    See application file for complete search history.

(56) References Cited

U.S. PATENT DOCUMENTS

| | | |
|---|---|---|
| 2012/0132953 A1 | 5/2012 | Becker et al. |
| 2014/0049825 A1* | 2/2014 | van Mol et al. ....... G02B 1/105 359/513 |
| 2015/0255751 A1 | 9/2015 | Schwamb |

FOREIGN PATENT DOCUMENTS

| | | |
|---|---|---|
| DE | 102014104099 A1 | 10/2015 |
| EP | 1930471 A2 | 6/2008 |
| WO | 02093653 A2 | 11/2002 |
| WO | 2014048898 A1 | 4/2014 |

OTHER PUBLICATIONS

German Search Report based on application No. 10 2015 118 417.6 (10 pages) dated Jul. 13, 2016 (Reference Purpose Only).

* cited by examiner

US 10,249,845 B2

OPTOELECTRONIC COMPONENT AND METHOD FOR PRODUCING AN OPTOELECTRONIC COMPONENT

CROSS-REFERENCE TO RELATED APPLICATION

The present application is a national stage entry according to 35 U.S.C. § 371 of PCT application No.: PCT/EP2016/074359 filed on Oct. 11, 2016, which claims priority from German Patent Application Serial No.: 10 2015 118 417.6 which was filed Oct. 28, 2015, and is incorporated herein by reference in its entirety.

TECHNICAL FIELD

The description relates to an optoelectronic component and to a method for producing an optoelectronic component.

SUMMARY

An optoelectronic component may be an electromagnetic radiation emitting component or an electromagnetic radiation absorbing component. An electromagnetic radiation absorbing component may be, as a non-limiting example, a solar cell. An electromagnetic radiation emitting component may be, for example, a light emitting component, for example, an LED or an OLED. Optoelectronic components on an organic basis, so-called organic optoelectronic components, are finding increasingly widespread application. By way of example, organic light emitting diodes (OLEDs) are making increasing inroads in general lighting, for example, as surface light sources.

An organic optoelectronic component, for example, an OLED, may include an anode and a cathode and an organic functional layer system therebetween. The organic functional layer system may include one or a plurality of emitter layers in which electromagnetic radiation is generated, a charge generating layer structure including in each case two or more charge generating layers (CGLs) for charge generation, and one or a plurality of electron blocking layers, also referred to as hole transport layers (HTLs), and one or a plurality of hole blocking layers, also referred to as electron transport layers (ETLs), in order to direct the current flow.

Top emitting OLEDs, so-called top emitters, in which an electrically conductive substrate is used for distributing current from the contacts to the transparent top electrode, are often fabricated with a structured planarization and/or insulation. In the case of a flexible OLED, a metal film, for example, may be used here as an electrically conductive substrate.

FIG. 1 shows a lateral sectional illustration of such a top emitting first conventional OLED 1.

FIG. 2 shows a plan view of the first conventional OLED 1 in accordance with FIG. 1. A, generally organic, electrically insulating layer 40 acting as planarization and/or insulation, in the finished component, is situated firstly in direct physical contact with an electrically conductive layer 12, which serves as a substrate and/or a carrier and secondly in direct physical contact with a functional layer structure, which includes in FIG. 1 from bottom to top a first electrode 20, an organic functional layer structure 22 and a second electrode 23, of the first conventional OLED 1. The second electrode 23 is situated in first contact sections 16 in direct physical contact with the electrically conductive layer 12 and may be electrically contacted via the latter. The first electrode 20 includes a second contact section 18, in which the first electrode 20 is exposed and may be electrically contacted.

If instances of outgassing occur from the planarization and/or insulation, in particular the electrically insulating layer 40, said instances of outgassing including, for example, solvent residues from the material of the electrically insulating layer 40, water residues from one or more cleaning steps or other contaminations, such as, for example, incompatible material constituents, such as crosslinking agents and/or hardening agents, etc., the first conventional OLED 1 may thereby be damaged.

In order to avoid this, sometimes a "bottom TFE" is used, that is to say a thin film encapsulation between the planarization and/or insulation and the OLED layer stack 20, 22, 23.

FIG. 3 shows a sectional illustration of such a second conventional OLED 2 including an electrically insulating encapsulation layer 5.

FIG. 4 shows a plan view of the second conventional OLED 2 in accordance with FIG. 3. The electrically insulating encapsulation layer 5 is formed above the electrically insulating layer 40 in direct physical contact with the electrically insulating layer 40 and is formed outside the electrically insulating layer 40 in direct physical contact with the electrically conductive layer 12. The electrically insulating encapsulation layer 5 is one or a plurality of transparent, electrically insulating layers, applied by means of ALD, for example, such as nanolaminates including aluminum oxide and titanium oxide. As an alternative thereto, the encapsulation layer 5 may also be translucent and/or non-transparent. Generally, as bottom encapsulation, layers are used such as are also known from top TFEs, that is to say encapsulation layers which are formed above the functional layer structures of the corresponding optoelectronic components and encapsulate the latter, for example, electrically insulating ALD layers. DE 10 2009 024 411 A1, for example, discloses such top TFEs and the materials and/or material combinations used therefor.

However, it is necessary to ensure that the transparent second electrode 23 is in electrical contact with the metal substrate, in particular with the electrically conductive layer 12, despite the electrically insulating bottom TFE, in particular the electrically insulating encapsulation layer 5. Therefore, if such an encapsulation layer is used as a bottom TFE, then at least one additional process step is necessary, in particular after the application of the bottom TFE and before the production of the top electrode. In said process step, the insulating bottom TFE is removed from the metal substrate by means of laser ablation in a partial region along and somewhat outside the structured planarization and/or insulation. Upon the application of the top electrode, an electrical contact between metal substrate and top electrode then arises in this exposed partial region. Therefore, the second conventional OLED 2 includes the first contact sections 16, in which the material of the second electrode 23 extends through corresponding cutouts of the electrically insulating encapsulation layer 5.

One object of the invention is to provide an optoelectronic component which is producible rapidly, in a simple manner, precisely, cost-effectively and/or with a few rejects.

One object of the invention is to provide a method for producing an optoelectronic component which is implementable rapidly, in a simple manner, precisely, cost-effectively and/or with a few rejects.

One object is achieved in accordance with one aspect of the invention by means of an optoelectronic component, including: an electrically conductive layer; an electrically insulating layer, which is formed above a partial region of the electrically conductive layer; an electrically weakly conductive encapsulation layer, which is formed outside the partial region on the electrically conductive layer and above the partial region on the electrically insulating layer; a first electrode, which is formed above the partial region on the electrically weakly conductive encapsulation layer; an organic functional layer structure, which is formed on the first electrode; and a second electrode, which is formed in the partial region on the organic functional layer structure and which is formed outside the partial region on the electrically weakly conductive encapsulation layer.

The second electrode, for example, a transparent top electrode, is thus electrically contacted with the electrically conductive layer, which may be formed, for example, as a metal substrate, through the electrically weakly conductive encapsulation layer formed as a bottom TFE. In this case, the electrical contacting is effected in the entire region in which the second electrode and the electrically conductive layer lie one above the other without further intermediate layers, such as, for example, the electrically insulating layer or the organic functional layer structure. This is the same region in which, even without the use of the encapsulation layer, in particular the bottom TFE, the electrical contacting between the second electrode and the electrically conductive layer would be effected; in particular, the areas in which the electrical contacting is effected are of the same size in both cases.

Consequently, the electrical contacting of the second electrode by means of the electrically conductive layer may be effected in a relatively large region. This contributes to a particularly good electrical connection between the second electrode and the electrically conductive layer. Moreover, a partial removal of the encapsulation layer is not necessary for the electrical contacting of the second electrode. This makes it possible to be able to dispense with at least one process step, namely the removal of the encapsulation layer. At the same time, the encapsulation layer prevents undesired substances, for example, from the electrically insulating layer, from passing into the overlying organic functional layer structure. This contributes to the fact that the optoelectronic component may be operated reliably and has a long lifetime. In this case, the application of the encapsulation layer, in particular of the bottom TFE, for example, in an ALD process, may be carried out in an unstructured fashion, i.e. uniformly over the entire component area, in particular over the entire area of the electrically conductive layer.

These technical effects contribute to the fact that the optoelectronic component is producible rapidly, in a simple manner, precisely, cost-effectively and/or with few rejects.

The saving of the additional process step for the laser ablation of the bottom TFE holds the potential for a faster overall production process and lower production costs, avoids the risk of problems in respect of rejects and/or yield as a result of laser ablation debris, avoids incompatibilities between bottom TFE laser ablation process and temporary application of the electrically conductive layer, in particular of the metal substrate on glass carriers, and affords the possibility of a vacuum inline process with bottom TFE deposition and deposition of the organic functional layer structures without problematic intermediate steps. Furthermore, the second electrode need not be led particularly far beyond an edge of the structured electrically insulating layer, for example, of the planarization and/or insulation layer, which may be the case in contrast thereto in the case of the laser ablation of the bottom TFE in order to provide enough space and/or tolerances for the laser-ablated region, as a result of which it is possible to maintain a small edge region and/or a high filling factor in a manner similar to that in the case of optoelectronic components without a bottom TFE.

At first glance, the electrically weakly conductive encapsulation layer, on which firstly the second electrode is formed and which is connected to the electrically conductive layer and on which secondly the first electrode is formed, entails the following problem: the electrically weakly conductive bottom TFE offers an electrical connection between the first electrode and the second electrode, for example, the anode and cathode, respectively, and/or between the first electrode and the electrically conductive layer, for example, the substrate, wherein the electrically conductive layer is used for current conduction toward the second electrode and generally even as an electrical contact for the second electrode. There would thus appear to be the risk of a short circuit between the first electrode and the second electrode and/or of high leakage currents. As a matter of fact, however, this is not a problem on account of the usually greatly different extents of the encapsulation layer in the thickness direction, for example, in the Z-direction, in comparison with the lateral extension directions thereof, for example, in the X- and Y-directions.

By way of a non-limiting example, in the case of an ALD bottom TFE having a typical layer thickness of 50 nm for electrical connection between the second electrode and the electrically conductive layer only 50 nm has to be overcome by the current in the thickness direction, for which reason it may be sufficient for the encapsulation layer to have only a weak electrical conductivity for a desirably low voltage drop. On the other hand, the distance between the first electrode and the electrically conductive layer along the encapsulation layer is typically a few millimeters, for which reason the weak electrical conductivity of the encapsulation layer is beneficial and a relevant electrical connection between the first electrode and the electrically conductive layer via the thin electrically weakly conductive encapsulation layer does not arise and may be disregarded. In contrast thereto, encapsulation layers known from the prior art are formed as electrical insulators and/or from electrically insulating material and connect the two electrodes to one another or they are electrically conductive barrier layers which are used as transparent electrodes and have the highest possible electrical conductivities for lateral current distribution, but do not produce an electrically conductive connection between the electrodes.

In one embodiment, the electrically weakly conductive encapsulation layer has a thickness in a range of 1 nm to 1000 nm, in particular of 10 nm to 150 nm, in particular of 25 nm to 75 nm, for example, approximately 50 nm. This contributes to the fact that, despite the inherently weak electrical conductivity of the encapsulation layer, the electrical conductivity in the thickness direction is so good that a reliable electrical contacting of the second electrode by means of the electrically conductive layer, specifically through the encapsulation layer, is ensured. At the same time, this contributes to the fact that despite the electrical coupling of the first electrode to the second electrode by means of the encapsulation layer in a lateral direction, that is to say perpendicularly to the thickness direction, no short circuit arises and/or leakage currents flowing on account of this electrical connection are negligibly low.

In an embodiment, the electrically weakly conductive encapsulation layer may have a resistivity in a range of 0.01

Ωm to 10 000 Ωm, in particular of 0.1 Ωm to 1000 Ωm, in particular of 1 Ωm to 100 Ωm, for example, approximately 10 Ωm. This may have the effect that the electrical conductivity in the thickness direction of the thin encapsulation layer is good enough that a reliable electrical contacting of the second electrode by means of the electrically conductive layer, specifically through the electrically weakly conductive encapsulation layer, is ensured. At the same time, this may have the effect that, despite the electrical coupling of the first electrode to the second electrode by means of the electrically weakly conductive encapsulation layer in a lateral direction, that is to say perpendicularly to the thickness direction, no short circuit arises and/or leakage currents flowing on account of this electrical connection are negligibly low.

Consequently, the fact that a layer or layer structure is electrically weakly conductive or has a weak electrical conductivity means that the corresponding layer or layer structure has a resistivity in a range of 0.01 Ωm to 10 000 Ωm, in particular of 0.1 Ωm to 1000 Ωm, in particular of 1 Ωm to 100 Ωm, for example, approximately 10 Ωm. In contrast thereto, in this application, the fact that a layer or a layer structure is electrically insulating or an electrical insulator is what is meant if the corresponding layer or layer structure has a resistivity of greater than $10^8$ Ωm. Furthermore, in this application, the fact that a layer or layer structure is electrically conductive or has a high electrical conductivity is what is meant if the corresponding layer or layer structure has a resistivity of less than 0.001 Ωm.

In an embodiment, a minimum distance from the first electrode to the second electrode along the electrically weakly conductive encapsulation layer is in a range of 0.01 mm to 50 mm, in particular of 0.1 mm to 5 mm, in particular of 0.4 mm to 2 mm, for example, approximately 1 mm. This contributes to the fact that despite the electrical coupling of the first electrode to the second electrode by means of the thin and electrically weakly conductive encapsulation layer in a lateral direction, that is to say perpendicularly to the thickness direction, no short circuit arises and/or leakage currents flowing on account of this electrical connection are negligibly low.

In an embodiment, the electrically weakly conductive encapsulation layer above the partial region is formed in direct physical contact with the electrically insulating layer. In other words, the electrically weakly conductive encapsulation layer is formed directly on the electrically insulating layer. Alternatively, or additionally, the electrically weakly conductive encapsulation layer outside the partial region is formed in direct physical contact with the electrically conductive layer. In other words, the electrically weakly conductive encapsulation layer outside the partial region, for example, laterally alongside the electrically insulating layer, is formed directly on the electrically conductive layer. The direct physical contact of the second electrode with the electrically weakly conductive encapsulation layer and the direct physical contact between the electrically weakly conductive encapsulation layer and the electrically conductive layer contribute to a particularly good electrical contacting of the second electrode by means of the electrically conductive layer. Alternatively or additionally, the first electrode is formed in direct physical contact with the electrically weakly conductive encapsulation layer. In other words, the first electrode is formed directly on the electrically weakly conductive encapsulation layer, in particular above the partial region and/or the electrically insulating layer. Alternatively or additionally, the second electrode is formed in direct physical contact with the electrically weakly conductive encapsulation layer.

In an embodiment, the electrically weakly conductive encapsulation layer includes or is formed from aluminum zinc oxide and/or doped aluminum zinc oxide.

In an embodiment, the electrically conductive layer is formed as a substrate or a carrier of the optoelectronic component. In other words, the electrically conductive layer is a mechanically stabilizing element of the optoelectronic component and/or, during the production of the optoelectronic component, serves as a starting element for forming thereon the further layers of the optoelectronic component.

In a further embodiment, the object may be achieved by means of a method for producing an optoelectronic component, wherein: an electrically conductive layer is provided; an electrically insulating layer is formed above a partial region of the electrically conductive layer; an electrically weakly conductive encapsulation layer is formed outside the partial region on the electrically conductive layer and above the partial region on the electrically insulating layer; a first electrode is formed above the partial region on the electrically conductive encapsulation layer; an organic functional layer structure is formed on the first electrode; and a second electrode is formed in the partial region on the organic functional layer structure and is formed outside the partial region on the electrically conductive encapsulation layer.

The advantages and developments of the optoelectronic component as mentioned above may be readily be applied to the method for producing the optoelectronic component.

In an embodiment, the electrically weakly conductive encapsulation layer is formed in an ALD process.

In an embodiment, the electrically weakly conductive encapsulation layer is formed with a thickness in a range of 1 nm to 1000 nm, in particular of 10 nm to 150 nm, in particular of 25 nm to 75 nm, for example, approximately 50 nm.

In an embodiment, the electrically weakly conductive encapsulation layer has a resistivity in a range of 0.01 Ωm to 10 000 Ωm, in particular of 0.1 Ωm to 1000 Ωm, in particular of 1 Ωm to 100 Ωm, for example, approximately Ωm, and is formed accordingly.

In an embodiment, a minimum distance from the first electrode to the second electrode along the electrically conductive encapsulation layer is in a range of 0.01 mm to 50 mm, in particular of 0.1 mm to 5 mm, in particular of 0.4 mm to 2 mm, for example, approximately 1 mm.

In an embodiment, the electrically conductive encapsulation layer above the partial region is formed in direct physical contact with the electrically insulating layer. Alternatively or additionally, the electrically conductive encapsulation layer outside the partial region is formed in direct physical contact with the electrically conductive layer. Alternatively or additionally, the first electrode is formed in direct physical contact with the electrically conductive encapsulation layer. Alternatively or additionally, the second electrode is formed in direct physical contact with the electrically conductive encapsulation layer.

In an embodiment, the electrically weakly conductive encapsulation layer includes or is formed from aluminum zinc oxide and/or doped aluminum zinc oxide.

In an embodiment, the electrically conductive layer is used as a substrate or a carrier of the optoelectronic component.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings in which.

DETAILED DESCRIPTION

In the following detailed description, reference is made to the accompanying drawings, which form part of this description and show for illustration purposes specific embodiments in which the invention may be implemented. Since component parts of embodiments may be positioned in a number of different orientations, the direction terminology serves for illustration and is not restrictive in any way whatsoever. It goes without saying that other embodiments may be used and structural or logical changes may be made, without departing from the scope of protection of the present invention. It goes without saying that the features of the various embodiments described herein may be combined with one another, unless specifically indicated otherwise. Therefore, the following detailed description should not be interpreted in a restrictive sense, and the scope of protection of the present invention is defined by the appended claims. In the figures, identical or similar elements are provided with identical reference signs, insofar as this is expedient.

An optoelectronic component may be an electromagnetic radiation emitting component or an electromagnetic radiation absorbing component. An electromagnetic radiation absorbing component may be, for example, a solar cell. In various embodiments, an electromagnetic radiation emitting component may be an electromagnetic radiation emitting semiconductor component and/or be formed as an electromagnetic radiation emitting diode, as an organic electromagnetic radiation emitting diode, as an electromagnetic radiation emitting transistor or as an organic electromagnetic radiation emitting transistor. The radiation may be, for example, light in the visible range, UV light and/or infrared light. In this context, the electromagnetic radiation emitting component may can be formed, for example, as a light emitting diode (LED), as an organic light emitting diode (OLED), as a light emitting transistor or as an organic light emitting transistor. In various embodiments, the light emitting component may be part of an integrated circuit. Furthermore, a plurality of light emitting components may be provided, for example, in a manner accommodated in a common housing.

Figure 1:
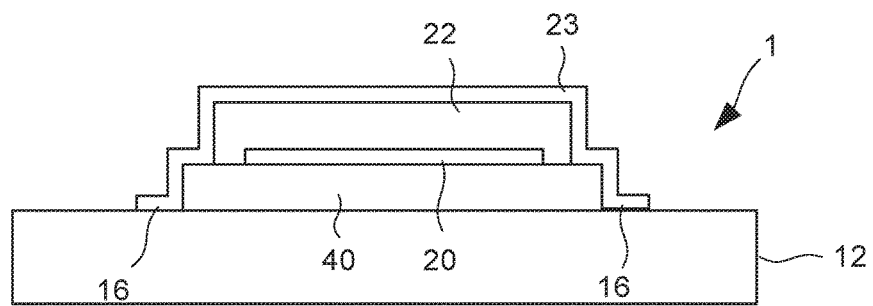
FIG. 1 shows a lateral sectional illustration of a conventional optoelectronic component.

FIG. 1 shows a lateral sectional illustration of a conventional optoelectronic component 1. The optoelectronic component 1 includes an electrically conductive layer 12. An electrically insulating layer 40 is formed on a partial region of the electrically conductive layer 12. A first electrode 20 is formed on the electrically insulating layer 40. An organic functional layer structure 22 for emitting and/or for absorbing light is formed on the first electrode 20. A second electrode 23 is formed on the organic functional layer structure 22, said second electrode 23 extending beyond the organic functional layer structure 22 onto an edge of the electrically insulating layer 40 and onto the electrically conductive layer 12 outside the partial region of the electrically conductive layer 12, that is to say laterally alongside the electrically insulating layer 40.

A first contact section 16 is formed in the region in which the second electrode 23 is in direct physical contact with the electrically conductive layer 12. In the first contact section 16, the second electrode 23 is electrically contacted by means of the electrically conductive layer 12. Consequently, the electrically conductive layer 12 serves for electrically contacting the second electrode 23.

Figure 2:
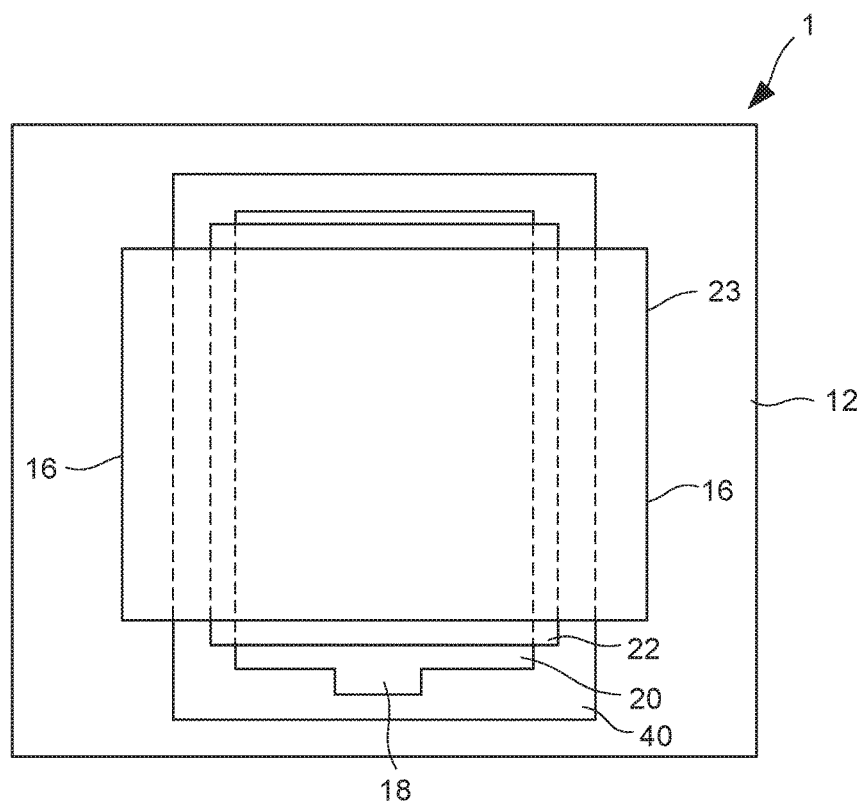
FIG. 2 shows a plan view of the conventional optoelectronic component in accordance with FIG. 1.

FIG. 2 shows a plan view of the conventional optoelectronic component 1 in accordance with FIG. 1. FIG. 1 reveals that the organic functional layer structure 22, the first electrode 20 and the electrically insulating layer 40 project at two sides below the second electrode 23. In particular, the first electrode 20 projects at at least one of the two sides below the second electrode 23 and below the organic functional layer structure 22 in such a way that said first electrode forms a second contact section 18, which is exposed and in which the first electrode 20 is electrically contactable.

Figure 3:
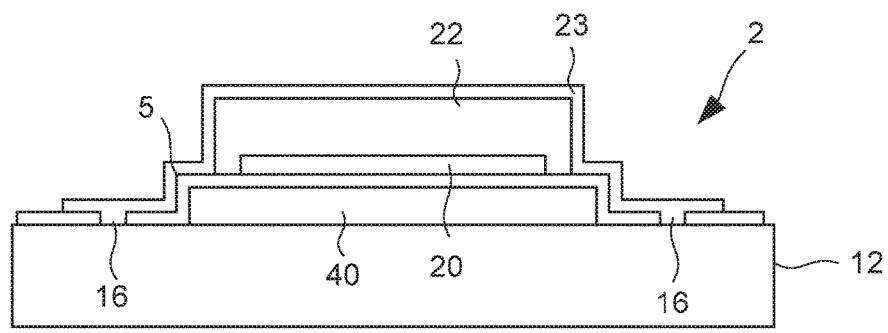
FIG. 3 shows a lateral sectional illustration of a conventional optoelectronic component.

FIG. 3 shows a lateral sectional illustration of a conventional optoelectronic component 2, which may, for example, largely correspond to the conventional optoelectronic component 1 shown in FIG. 1. The conventional optoelectronic component 2 includes an electrically insulating encapsulation layer 5, which extends over the electrically insulating layer 40 and beyond the electrically insulating layer 40 onto the electrically conductive layer 12 and encapsulates the electrically insulating layer 40.

Outside that partial region of the electrically conductive layer 12 in which the electrically insulating layer 40 is formed, the electrically insulating encapsulation layer 5 has cutouts in which the second electrode 23 extends through the electrically insulating encapsulation layer 5 to the electrically conductive layer 12 and is formed in direct physical contact with the latter and in which the first contact sections 16 are formed. The second electrode 23 is electrically coupled and electrically contactable by means of the electrically conductive layer 12 in the first contact sections 16.

Figure 4:
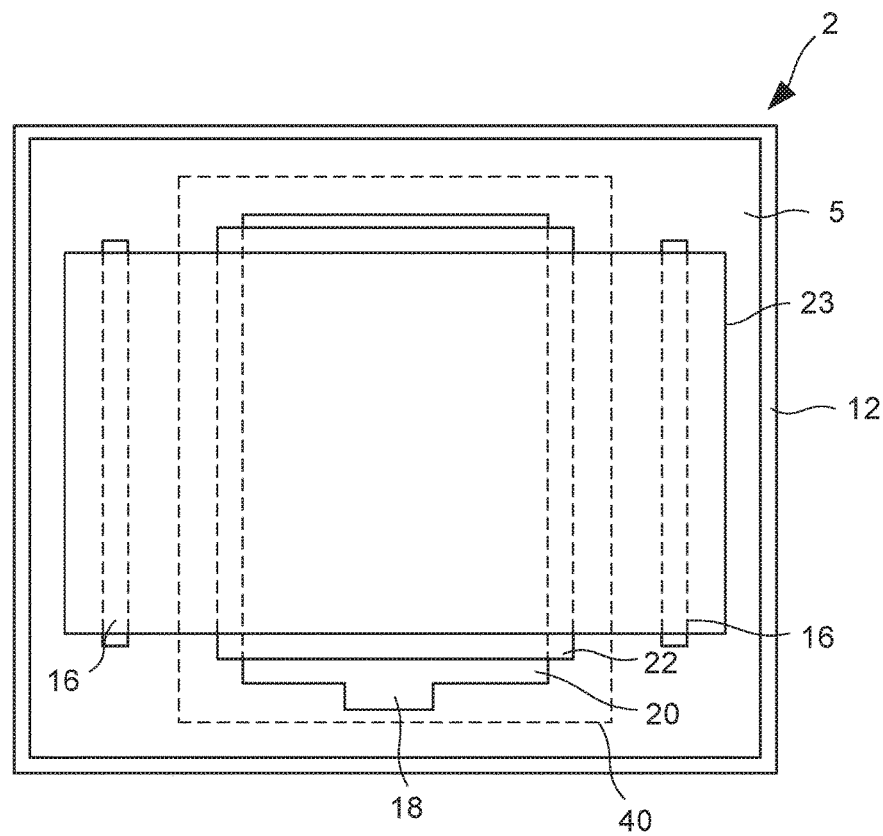
FIG. 4 shows a plan view of the conventional optoelectronic component in accordance with FIG. 3.

FIG. 4 shows a plan view of the conventional optoelectronic component 2 in accordance with FIG. 3. FIG. 4 reveals that the electrically insulating encapsulation layer 5 extends over virtually the entire electrically conductive layer 12 and completely encapsulates the electrically insulating layer 40 together with the electrically conductive layer 12.

The first contact sections 16 of the first conventional optoelectronic component 2 shown in FIGS. 3 and 4 are significantly smaller than the first contact sections 16 of the first conventional optoelectronic component 1 shown in FIGS. 1 and 2, since the former are formed only in the cutouts of the electrically insulating encapsulation layer 5. Moreover, the second electrode 23 shown in FIGS. 3 and 4 has to extend relatively far beyond the partial region of the electrically conductive layer 12 and the electrically insulating layer 40 toward the outside in order that it may be physically and electrically connected via the cutouts of the electrically conductive layer 12. At the same time, however, the formation of the cutouts inherently requires a certain lateral minimum distance between the cutouts and the electrically insulating layer 40.

Figure 5:
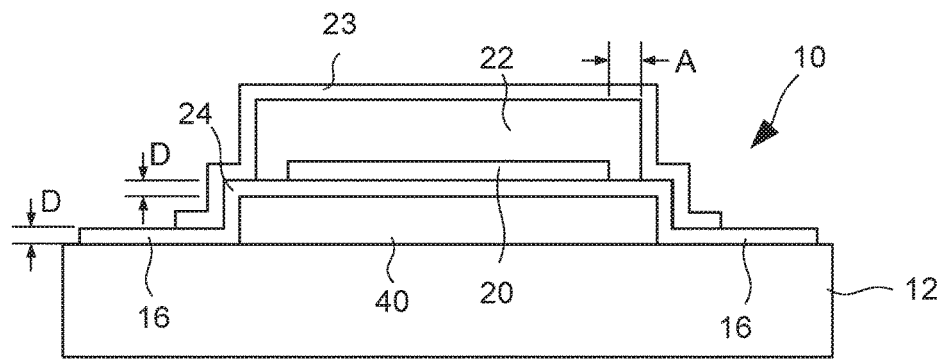
FIG. 5 shows a lateral sectional illustration of one embodiment of an optoelectronic component.

FIG. 5 shows a lateral sectional illustration of one embodiment of an optoelectronic component 10. The optoelectronic component 10 includes an electrically conductive layer 12. The electrically conductive layer 12 has a high electrical conductivity. In particular, the electrically conductive layer 12 forms an electrical conductor. The electrically conductive layer 12 may be formed, for example, as a carrier and/or as a substrate. The carrier may be formed as translucent or transparent. The carrier and/or the substrate serves as a carrier element for electronic elements or layers, for example, light emitting elements. The carrier may include, for example, plastic, metal, glass, quartz and/or a semiconductor material. Furthermore, the carrier may include or be formed from one plastics film or a laminate including one or including a plurality of plastics films. The carrier may be formed as mechanically rigid or mechanically flexible.

An electrically insulating layer 40 is formed on a partial region of the electrically conductive layer 12. The electrically insulating layer 40 serves as a planarization layer and/or as an electrical insulation layer. The electrically insulating layer 40 has a particularly low electrical conductivity and is in particular an electrical insulator.

An electrically weakly conductive encapsulation layer 24 is formed above the electrically insulating layer 40. The electrically weakly conductive encapsulation layer 24 extends over the electrically insulating layer 40 and beyond the electrically insulating layer 40 directly onto the electrically conductive layer 12. In particular, the electrically weakly conductive encapsulation layer 24 outside the partial region in which the electrically insulating layer 40 is formed is in direct physical contact with the electrically conductive layer 12. The electrically weakly conductive encapsulation layer 24 has a thickness D in a range of 1 nm to 1000 nm, in particular of 10 nm to 150 nm, in particular of 25 nm to 75 nm, for example, approximately 50 nm. The electrically weakly conductive encapsulation layer 24 has a higher electrical conductivity than the electrically insulating layer 40 and a lower electrical conductivity than the electrically conductive layer 12. The electrically weakly conductive encapsulation layer 24 has a resistivity in a range of 0.01 $\Omega$m to 10 000 $\Omega$m, in particular of 0.1 $\Omega$m to 1000 $\Omega$m, in particular of 1 $\Omega$m to 100 $\Omega$m, for example, approximately 10 Ohm m.

An optoelectronic layer structure is formed above the electrically insulating layer 40 and on the electrically weakly conductive encapsulation layer 24. The optoelectronic layer structure includes a first electrode 20. The first electrode 20 may be formed as an anode or as a cathode. The first electrode 20 may be formed as translucent or transparent. The first electrode 20 includes an electrically conductive material, for example, metal and/or a transparent conductive oxide (TCO) or a layer stack of a plurality of layers including metals or TCOs. The first electrode 20 may include, for example, a layer stack of a combination of a layer of a metal on a layer of a TCO, or vice versa. One example is a silver layer applied on an indium tin oxide (ITO) layer (Ag on ITO) or ITO-Ag-ITO multilayers. The first electrode 20 may include as an alternative or in addition to the materials mentioned: networks composed of metallic nanowires and nanoparticles, for example, composed of Ag, networks composed of carbon nanotubes, graphene particles and graphene layers and/or networks composed of semiconducting nanowires.

An optically functional layer structure, for example, an organic functional layer structure 22, of the optoelectronic layer structure is formed above the first electrode 20. The organic functional layer structure 22 may include, for example, one, two or more partial layers. By way of example, the organic functional layer structure 22 may include a hole injection layer, a hole transport layer, an emitter layer, an electron transport layer and/or an electron injection layer. The hole injection layer serves for reducing the band gap between first electrode and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the electrons. The electron injection layer serves for reducing the band gap between second electrode and electron transport layer. Furthermore, the organic functional layer structure 22 may include one, two or more functional layer structure units each including the partial layers mentioned and/or further intermediate layers.

A second electrode 23 of the optoelectronic layer structure is formed above the organic functional layer structure 22. The second electrode 23 may be formed in accordance with one of the configurations of the first electrode 20, wherein the first electrode 20 and the second electrode 23 may be formed identically or differently. The first electrode 20 serves, for example, as an anode or a cathode of the optoelectronic layer structure. The second electrode 23, in a manner corresponding to the first electrode, serves as a cathode or respectively an anode of the optoelectronic layer structure. The second electrode 23 extends beyond the organic functional layer structure 22 right onto the electrically weakly conductive encapsulation layer 24 and also beyond the partial region in which the electrically insulating layer 40 is formed. Outside said partial region, in particular in first contact sections 16, the second electrode 23 is in direct physical contact with the electrically weakly conductive encapsulation layer 24. In the first contact sections 16, therefore, the second electrode 23 is coupled to the electrically conductive layer 12 via the electrically weakly conductive encapsulation layer 24.

A minimum distance A from the first electrode 20 to the second electrode 23 along the electrically weakly conductive encapsulation layer 24 is in a range of 0.01 mm to 50 mm, in particular of 0.1 mm to 5 mm, in particular of 0.4 mm to 2 mm, for example, approximately 1 mm.

The relatively small thickness D of the electrically weakly conductive encapsulation layer 24 makes it possible that the second electrode 23 is electrically well contactable in the first contact sections 16 through the electrically weakly conductive encapsulation layer 24 since the small thickness D counteracts the weak electrical conductivity, such that as a result in the thickness direction, that is to say in the vertical direction in FIG. 5, of the electrically weakly conductive encapsulation layer 24 only a small voltage drop across the electrically weakly conductive layer 24 arises and a sufficiently large current flow from the electrically conductive layer 12 toward the second electrode 23 is possible.

In contrast thereto, the relatively large minimum distance A from the first electrode 20 to the second electrode 23 along the electrically weakly conductive encapsulation layer 24 has the effect that the weak electrical conductivity of the electrically weakly conductive encapsulation layer 24 in this direction, that is to say in a lateral direction, that is to say in the horizontal direction in FIG. 5, fully takes effect and only a very low leakage current, which is negligible in particular for many applications, and no appreciable short circuit arise.

By way of example, in the first contact section 16 there results approximately a voltage drop of 1.0 mV from the second electrode 23 to the electrically conductive layer 12 and from the first electrode 20 toward the second electrode 23 there results a leakage current of approximately 6.3 µA, under the assumptions that the optoelectronic component 10 has an active area, for example, a luminous area, of 44.2 cm$^2$, that the sum of the contact areas between the second electrode 23 and the electrically weakly conductive encapsulation layer 24 in the first contact sections 16 is 223.6 mm$^2$, that the electrically weakly conductive encapsulation layer 24 has a resistivity of 10 Ωm and a thickness D of 50 nm and hence a contact resistance from the electrode 23 via the electrically weakly conductive encapsulation layer 24 in the region of the contact regions 16 to the electrically conductive layer 12 is $2.2*10^{-3}\Omega$, and that during operation of the optoelectronic component 10 an operating current density of 10 mA/cm$^2$ is present, hence an operating current of 0.442 A flows and an operating voltage of 5V is present.

The optoelectronic layer structure is an electrically and/or optically active region. The active region is, for example, that region of the optoelectronic component 10 in which electric current for the operation of the optoelectronic component 10 flows and/or in which electromagnetic radiation is generated or absorbed.

A getter structure (not illustrated) may be arranged on or above the active region. The getter layer can be formed as translucent, transparent or opaque. The getter layer may include or be formed from a material which absorbs and binds substances that are harmful to the active region.

Optionally, a further encapsulation layer 24, not illustrated in the figures, of the optoelectronic layer structure may be formed above the second electrode 23, and encapsulates the optoelectronic layer structure. The electrically weakly conductive encapsulation layer 24 and/or the further encapsulation layer may be formed as a barrier layer, for example, as a barrier thin-film layer. The encapsulation layers 24 may also be referred to as thin film encapsulations. The encapsulation layers 24 form a barrier vis-à-vis chemical contaminants and/or atmospheric substances, in particular vis-à-vis water (moisture) and oxygen. The encapsulation layers may in each case be formed as a single layer, a layer stack or a layer structure. The encapsulation layers may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof, wherein the electrically weakly conductive encapsulation layer 24 is electrically weakly conductive, and wherein the further encapsulation layer may be formed in an electrically insulating fashion, for example.

Optionally, a covering (not illustrated) may be formed above the further encapsulation layer. The covering may include, for example, an adhesion-medium layer (not illustrated) and/or a covering body (not illustrated). The adhesion-medium layer includes, if appropriate, for example, an adhesion medium, for example, an adhesive, for example, a lamination adhesive, a lacquer and/or a resin. The adhesion-medium layer may include, for example, particles which scatter electromagnetic radiation, for example, light scattering particles. The adhesion-medium layer serves, if appropriate, for example, for securing the covering body to the further encapsulation layer. The covering body includes, if appropriate, for example, plastic, glass and/or metal. By way of example, the covering body may substantially be formed from glass and include a thin metal layer, for example, a metal film, and/or a graphite layer, for example a graphite laminate, on the glass body. The covering body serves, if appropriate, for protecting the optoelectronic component 10, for example, against mechanical force influences from outside. Furthermore, the covering body may serve for distributing and/or dissipating heat that is generated in the optoelectronic component 10. By way of example, the glass of the covering body may serve as protection against external influences and the metal layer of the covering body may serve for distributing and/or dissipating the heat that arises during the operation of the optoelectronic component 10.

In the case of the embodiment shown in FIG. 5, the minimum distance A is determined by that material of the organic functional layer structure which is formed in a lateral direction between the first electrode 20 and the second electrode 23. Optionally, an electrically insulating insulation material (not illustrated) may be formed laterally alongside the first electrode 20 and possibly also on the laterally outer edge of the first electrode 20, specifically such that in a lateral direction the interspace between the first electrode 20 and the second electrode 23 is wholly or partly filled by the insulation material. If appropriate, the minimum distance A is then determined wholly or partly by the insulation material.

Figure 6:
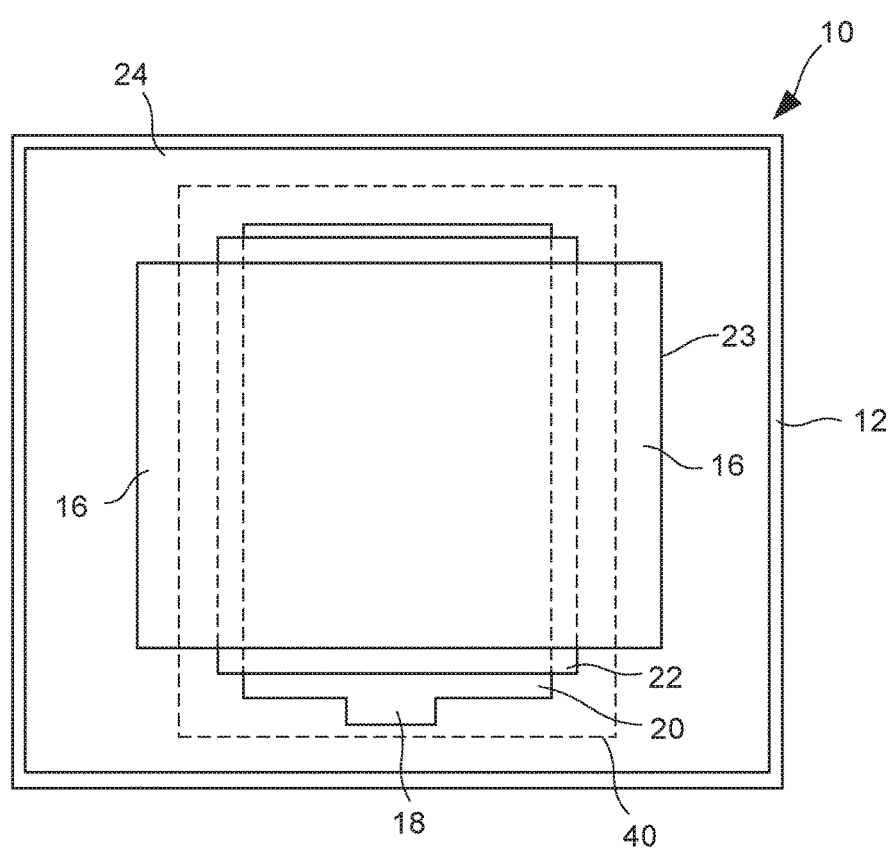
FIG. 6 shows a plan view of the optoelectronic component in accordance with FIG. 5.

FIG. 6 shows a plan view of the optoelectronic component 10 in accordance with FIG. 5. FIG. 6 reveals that the electrically weakly conductive encapsulation layer 24 extends virtually over the entire area of the electrically conductive layer 12. Optionally, however, the electrically weakly conductive encapsulation layer 24 may extend over the entire electrically conductive layer 12, which may contribute to the fact that the electrically weakly conductive encapsulation layer 24 may be produced particularly simply, in particular over the whole area of the electrically conductive layer 12. The electrically weakly conductive encapsulation layer 24 in cooperation with the electrically conductive layer 12 encapsulates the electrically insulating layer 40. The first electrode 20 projects below the organic functional layer structure 22 and the second electrode 23 in such a way that the said first electrode forms a second contact section 18. The first electrode 20 is electrically contactable by means of the second contact section 18.

Since, in the case of the optoelectronic component 10, on account of the indeed weak, but sufficiently provided electrical conductivity of the electrically weakly conductive encapsulation layer 24, it is possible to dispense with the cutouts for producing the electrical contacting of the second electrode 23, the second electrode 23 may be formed in such a way that it extends only slightly beyond the partial region of the electrically conductive layer 12 and the electrically insulating layer 40 toward the outside.

Figure 7:
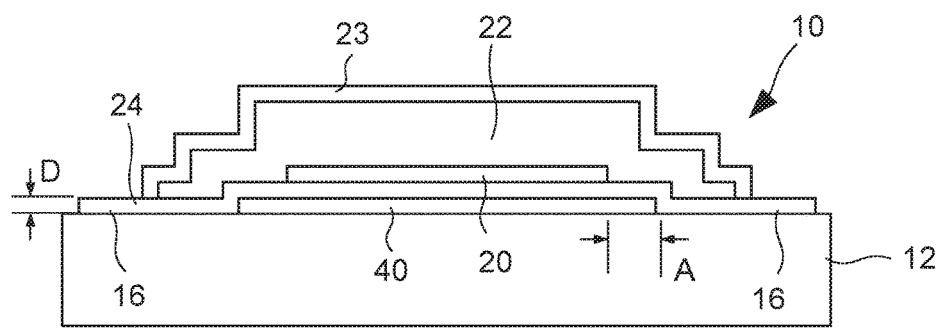
FIG. 7 shows a lateral sectional illustration of one embodiment of an optoelectronic component.

FIG. 7 shows a lateral sectional illustration of one embodiment of an optoelectronic component 10, which may largely correspond to the embodiment explained with reference to FIGS. 5 and 6. In contrast thereto, however, the organic functional layer structure 20 has been drawn in a lateral direction toward the outside beyond the electrically insulating layer 40, for which reason the shortest electrically conductive path length proceeding from the first electrode 20 along the electrically weakly conductive encapsulation layer 24 toward the closest electrically conductive structure no longer extends through to the second electrode 23, but rather through to the electrically conductive layer 12. In other words, the electrically conductive structure closest to the first electrode 20 along the electrically weakly conductive encapsulation layer 24 is no longer the second electrode 23, but rather the electrically conductive layer 12. Therefore, in this embodiment, the minimum distance A is determined by the distance between the first electrode 20 and the electrically conductive layer 12, measured along the electrically weakly conductive encapsulation layer 24.

Figure 8:
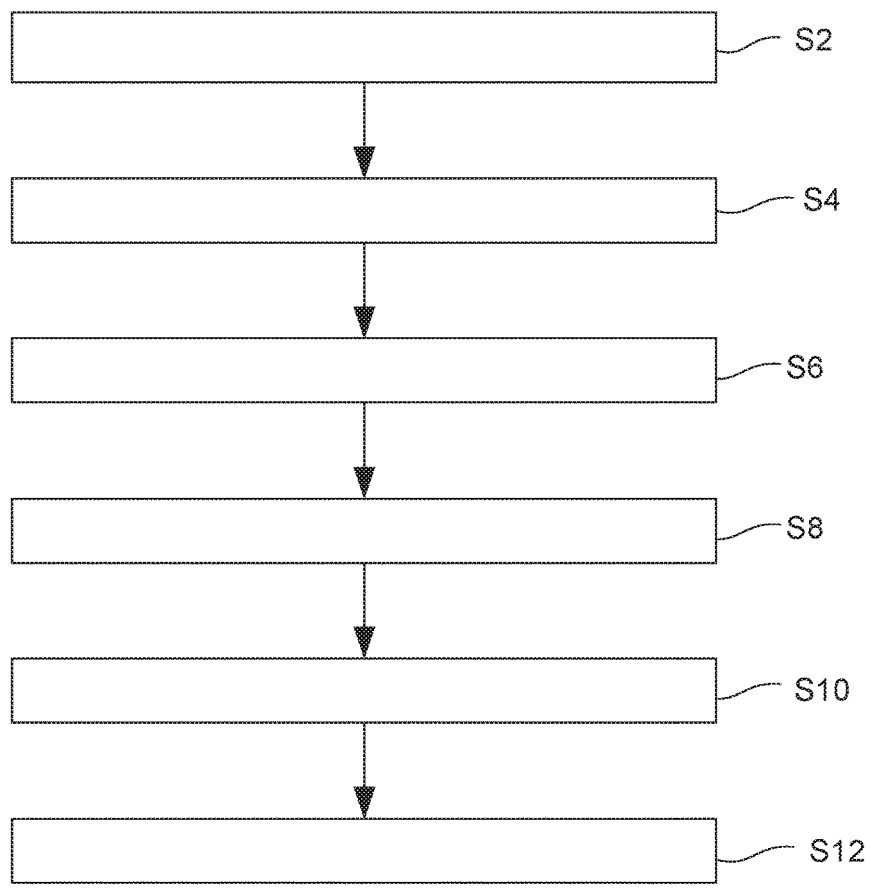
FIG. 8 shows a flow diagram of one embodiment of a method for producing an optoelectronic component.

FIG. 8 shows a flow diagram of a method for producing an optoelectronic component, for example, the optoelectronic component 10 explained above.

In step S2, an electrically conductive layer is provided. By way of example, the electrically conductive layer 12 explained above is provided; by way of example, the electrically conductive layer 12 is formed. The electrically conductive layer 12 may be, for example, a metal film.

In step S4, an electrically insulating layer is formed. By way of example, the electrically insulating layer 40 is formed in the partial region on the electrically conductive layer 12. The electrically insulating layer 40 may include or be formed from, for example, plastic, for example, a synthetic resin, and/or a lacquer. The electrically insulating layer 40 may be formed on the electrically conductive layer 12, for example, in a printing method.

In step S6, an electrically weakly conductive encapsulation layer is formed. By way of example, the electrically weakly conductive encapsulation layer 24 is formed such that it extends over and beyond the electrically insulating layer 40, such that it encapsulates the electrically insulating layer 40 in cooperation with the electrically conductive layer 12. Moreover, the electrically weakly conductive encapsulation layer 24 is formed such that outside the partial region in which the electrically insulating layer 40 is formed said electrically weakly conductive encapsulation layer 24 is in direct physical contact with the electrically conductive layer 12. Optionally, the electrically weakly conductive encapsulation layer 24 may be formed such that it extends over the entire electrically conductive layer 12.

In step S8, a first electrode is formed. By way of example, the first electrode 20 is formed above the partial region of the electrically conductive layer 12 and above the electrically insulating layer 40 on the electrically weakly conductive encapsulation layer 24.

In step S10, an organic functional layer structure is formed. By way of example, the organic functional layer structure 22 is formed on the first electrode 20.

In step S12, a second electrode is formed. By way of example, the second electrode 23 is formed in such a way that it extends beyond the organic functional layer structure 22, the partial region of the electrically conductive layer 12 and/or the electrically insulating layer 40 and that outside the partial region said second electrode is in direct physical contact with the electrically weakly conductive encapsulation layer 24.

The invention is not restricted to the embodiments specified. By way of example, the electrically conductive layer 12 may be formed on a carrier or a substrate.

While the invention has been particularly shown and described with reference to specific embodiments, it should be understood by those skilled in the art that various changed in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE SIGNS

Conventional OLED 2
Electrically conductive layer 12
Electrically insulating encapsulation layer 5
Optoelectronic component 10
First contact section 16
Second contact section 18
First electrode 20
Organic functional layer structure 22
Second electrode 23
Electrically weakly conductive encapsulation layer 24
Electrically insulating layer 40
Minimum distance A
Thickness D
Steps S2 to S12

The invention claimed is:

1. An optoelectronic component, comprising
an electrically conductive layer,
an electrically insulating layer formed above a partial region from the electrically conductive layer,
an electrically weakly conductive encapsulation layer formed outside the partial region on the electrically conductive layer and above the partial region on the electrically insulating layer,
a first electrode formed above the partial region on the electrically weakly conductive encapsulation layer,
an organic functional layer structure formed on the first electrode, and
a second electrode formed above the partial region on the organic functional layer structure and where the second electrode is formed outside the partial region on the electrically weakly conductive encapsulation layer.

2. The optoelectronic component as claimed in claim 1, wherein the electrically weakly conductive encapsulation layer has a thickness in a range from 10 nm to 150 nm.

3. The optoelectronic component as claimed in claim 1, wherein the electrically weakly conductive encapsulation layer has a resistivity in a range from 0.01 Ωm to 10 000 Ωm.

4. The optoelectronic component according to claim 1, wherein a minimum distance from the first electrode to the second electrode or to the electrically conductive layer along the electrically weakly conductive encapsulation layer is in a range from 0.01 mm to 50 mm.

5. The optoelectronic component according to claim 1, wherein
the electrically weakly conductive encapsulation layer above the partial region is formed in direct physical contact with the electrically insulating layer, and/or
the electrically weakly conductive encapsulation layer outside the partial region is formed in direct physical contact with the electrically conductive layer, and/or
the first electrode is formed in direct physical contact with the electrically weakly conductive encapsulation layer, and/or
the second electrode is formed in direct physical contact with the electrically weakly conductive encapsulation layer.

6. The optoelectronic component according to claim 1, wherein the electrically weakly conductive encapsulation layer comprises or is formed from aluminum zinc oxide and/or doped aluminum zinc oxide.

7. The optoelectronic component according to claim 1, wherein the electrically conductive layer is formed as a substrate or a carrier of the optoelectronic component.

8. A method for producing an optoelectronic component, wherein
an electrically conductive layer is provided,
an electrically insulating layer is formed above a partial region of the electrically conductive layer, an electrically weakly conductive encapsulation layer is formed outside the partial region on the electrically conductive layer and above the partial region on the electrically insulating layer, a first electrode is formed above the partial region on the electrically weakly conductive encapsulation layer, an organic functional layer structure is formed on the first electrode, and a second electrode is formed above the partial region on the organic functional layer structure and is formed outside the partial region on the electrically weakly conductive encapsulation layer.

9. The method as claimed in claim 8, wherein the electrically weakly conductive encapsulation layer is formed in an ALD process.

10. The method as claimed in claim 8, wherein the electrically weakly conductive encapsulation layer is formed with a thickness in a range from 1 nm to 1000 nm.

11. The method as claimed in claim 8, wherein the electrically weakly conductive encapsulation layer has a resistivity in a range from 0.01 Ωm to 10 000 Ωm.

12. The method as claimed in claim 8, wherein a minimum distance from the first electrode to the second electrode or to the electrically conductive layer along the electrically weakly conductive encapsulation layer is in a range from 0.01 mm to 50 mm.

13. The method as claimed in claim 8, wherein the electrically weakly conductive encapsulation layer above the partial region is formed in direct physical contact with the electrically insulating layer, and/or the electrically weakly conductive encapsulation layer outside the partial region is formed in direct physical contact with the electrically conductive layer, and/or the first electrode is formed in direct physical contact with the electrically weakly conductive encapsulation layer, and/or the second electrode is formed in direct physical contact with the electrically weakly conductive encapsulation layer.

14. The method as claimed in claim 8, wherein the electrically weakly conductive encapsulation layer comprises or is formed from aluminum zinc oxide and/or doped aluminum zinc oxide.

15. The method as claimed in claim 8, wherein the electrically conductive layer is used as a substrate or a carrier of the optoelectronic component.

* * * * *